US005693911A

United States Patent [19]
Sydow

[11] Patent Number: 5,693,911
[45] Date of Patent: Dec. 2, 1997

[54] ADHESIVE LABEL WITH MARKING SURFACE FOR AN ELECTRICAL COVER PLATE

[76] Inventor: P. Daniel Sydow, 8120 Glenwillow La., #206,, Indianapolis, Ind. 46278

[21] Appl. No.: 533,707

[22] Filed: Sep. 26, 1995

[51] Int. Cl.6 .................................................. H05K 5/03
[52] U.S. Cl. .................. 174/66; 220/241; 283/81; 283/117; 40/638
[58] Field of Search ........................ 174/66, 67; 220/241, 220/242; 33/1 B, 563, 564; 283/81, 117; D10/64; 40/630, 638, 594

[56] References Cited

U.S. PATENT DOCUMENTS

| | | | |
|---|---|---|---|
| 1,829,422 | 10/1931 | Seltzer | 220/241 |
| 2,515,820 | 7/1950 | Clark | 40/134 |
| 3,840,692 | 10/1974 | Wells | 174/66 |
| 4,163,137 | 7/1979 | Close, Jr. | 200/302 |
| 4,341,920 | 7/1982 | Reich | 174/66 |
| 4,353,759 | 10/1982 | Stallings | 156/64 |
| 4,385,460 | 5/1983 | Hanna | 283/81 X |
| 4,447,484 | 5/1984 | Slosberg et al. | 428/137 |
| 4,479,317 | 10/1984 | Hanna | 174/66 X |
| 4,780,573 | 10/1988 | Own | 174/66 |
| 4,800,239 | 1/1989 | Hill | 174/66 |
| 4,833,277 | 5/1989 | Jacoby, Jr. et al. | 174/66 |
| 5,212,899 | 5/1993 | Fandreyer | 40/642 |
| 5,321,206 | 6/1994 | Hibler | 174/66 |

OTHER PUBLICATIONS

Sample, "Paper Cover for Face Plate", distributed to Patent Office employees on Sep. 20, 1973.

Primary Examiner—Kristine L. Kincaid
Assistant Examiner—Dean A. Reichard
Attorney, Agent, or Firm—Woodard, Emhardt, Naughton, Moriarty & McNett

[57] ABSTRACT

A label which is cut and sized to fit on the interior surface of an electrical cover plate, such as a cover plate which is affixed over a light switch or an electrical outlet. The exterior dimensions of the label are formed to be approximately the same size as the flat dimension on the back of the electrical cover plate, such that the label does not extend onto any beveled side portions of the electrical cover plate. Furthermore, the label has formed therein appropriate cut-outs in order to allow the electrical switch or electrical plug to protrude therethrough, as well as holes to allow the electrical cover plate screws to pass therethrough. The label may include an adhesive coating on one side which is adapted to semi-permanently adhere to the back of the electrical cover plate. The opposite side of the label comprises a smooth, calendered surface which is adapted to be easily written upon by a pen or pencil.

5 Claims, 2 Drawing Sheets

ADHESIVE LABEL WITH MARKING SURFACE FOR AN ELECTRICAL COVER PLATE

TECHNICAL FIELD OF THE INVENTION

The present invention generally relates to adhesive labels and, more particularly, to an adhesive label with marking surface for an electrical cover plate.

BACKGROUND OF THE INVENTION

Currently, it is very common for the interior walls and wood trim of a room in a home or office to be covered with paint in order to provide a protective and decorative finish. In many instances, a first color of paint is applied to the walls and a second, complimentary, color of paint is applied to the wood trim. Usually, when such painting has been completed, the unused paint materials are discarded without making a record of the brand, color code and quantity of paint used to paint the walls and trim of the room. Usually no record is made of these facts because there is no convenient place to keep such information. If this information were to be recorded upon a piece of paper, it is likely that the owner of the house would not be able to locate the piece of paper in the future when it is time to repaint the room. Because owners often desire to repaint the room in the same shade that was originally applied to the room and trim, or in cases when it is necessary to repaint a portion of the room in order to touch-up some mar or blemish, it is desirable to know the brand and color code originally used to paint the room so that a match can be made. Additionally, if the entire room is being painted, it is desirable to know the quantity of paint used so that a like quantity may be purchased for the new application.

All of this information is valuable to the home owner and may be used in the future to save time and money and to minimize the inconvenience of repainting the room. However, because there is no convenient place to record such information, it is often simply not recorded and therefore cannot be utilized in the future. There is therefore a need in the prior art for a convenient means to make a permanent record of information relating to the painting of a room. Such information may include, for example, the brand of paint used, the color code of the paint, and the quantity of paint used. The present invention is directed toward meeting this need.

SUMMARY OF THE INVENTION

The present invention relates to a label which is cut and sized to fit on the interior surface of an electrical cover plate, such as a cover plate which is affixed over a light switch or an electrical outlet. The exterior dimensions of the label are formed to be approximately the same size as the flat dimension on the back of the electrical cover plate, such that the label does not extend onto any beveled side portions of the electrical cover plate. Furthermore, the label has formed therein appropriate cut-outs in order to allow the electrical switch or electrical plug to protrude therethrough, as well as holes to allow the electrical cover plate screws to pass therethrough. The label may include an adhesive coating on one side which is adapted to semi-permanently adhere to the back of the electrical cover plate. The opposite side of the label comprises a smooth, calendered surface which is adapted to be easily written upon by a pen or pencil.

In one form of the invention, a label, for application to an electrical cover plate is disclosed, comprising: a label body having a first side and a second side; wherein the first side of the label body has a smooth, calendered surface so that the first side may be written upon with a pencil; wherein first exterior dimensions of the label body are smaller than second exterior dimensions of the electrical cover plate.

In another form of the invention, the combination is disclosed, comprising: an electrical cover plate adapted to be mounted to a wall and having a front surface facing away from the wall when mounted, a rear surface facing an interior of the wall when mounted and a bevel at a perimeter of the electrical cover plate; and a label having a first side and a second side; wherein the second side of the label is mounted to the rear surface of the electrical cover plate; wherein the first side of the label has a smooth, calendered surface so that the first side may be written upon with a pencil; and wherein the label is contained completely within the perimeter bevel of the electrical cover plate.

In another form of the invention, a method of archiving information about room decorations is disclosed, comprising the steps of: (a) collecting the information about the room decorations; (b) recording the information upon a first surface of an adhesive label; (c) mounting the label to a rear surface of an electrical cover plate; and (d) attaching the electrical cover plate to a wall such that the label faces an interior of the wall.

DETAILED DESCRIPTION OF THE PREFERRED EMBODIMENT

Figure 1:
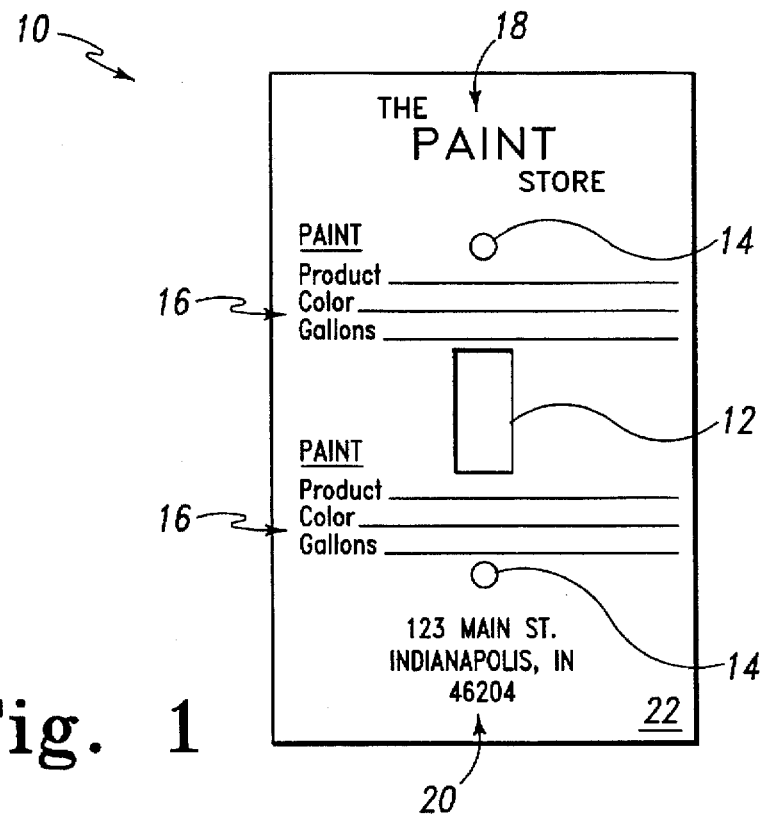
FIG. 1 is a top plan view of a first embodiment of the adhesive label of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Virtually every interior room of a home or office includes at least one light switch or electrical outlet which is covered by a protective cover plate. The cover plate mounts flush with the surface of the wall and serves to keep foreign objects and other contaminants from coming into contact with the light switch or electrical outlet. Such cover plates are also used for other types of wall mounted devices, such as cable television cables, computer network cables, etc. Because such electrical cover plates are securely mounted flush with the wall's surface, the rear surfaces of these electrical cover plates (i.e. the surfaces which face the interior of the wall) are hidden from sight and relatively well protected from any type of disturbance. Furthermore, it is very uncommon for such electrical cover plates to be replaced once they have been installed into a room. The back surface of the electrical cover plate therefore represents an ideal location for recording information concerning the paint used to paint the room in which the electrical cover plate is located.

However, the rear surface of such electrical cover plates does not lend itself to recording such information. Almost all such electrical cover plates are formed from a hard, durable plastic material which may not be written upon with an ordinary ball point pen or a pencil. Furthermore, many such electrical cover plates have reinforcing ribs and the like on their rear surface and therefore have no large, flat surfaces upon which to record the information. In order to make the rear surface of such electrical cover plates adapted for recording paint information, the present invention is directed toward an adhesive label which is adapted to adhere to the rear surface of the electrical cover plate without interfering with the functionality of the electrical cover plate. Such an adhesive label also includes a marking surface which may easily be written upon with a ball point pen or a pencil.

Referring to FIG. 1, there is illustrated a first embodiment adhesive label of the present invention, indicated generally at 10. The adhesive label 10 is formed with exterior dimensions which allow it to fit upon the rear surface of a standard electrical cover plate. The first embodiment adhesive label 10 is designed to fit to the rear of an electrical cover plate for a single light switch. It will be appreciated by those skilled in the art that similar adhesive labels may be designed for cover plates which cover multiple light switches.

The label 10 includes a rectangular central cut-out 12 which is just slightly larger than the central cut-out of the electrical cover plate through which the light switch passes. The adhesive label also includes a pair of circular cut-outs 14 which are formed to be slightly larger than the circular cut-outs of the electrical cover plate through which the mounting screws for the cover plate pass. By providing the cut-outs 12 and 14, the adhesive label 10 may be mounted to the back of the electrical cover plate without interfering with the functionality of the cover plate. The adhesive label 10 includes pre-printed spaces thereon for recording the brand, color code and quantity of paint used to paint the room in which the adhesive label is located. It will be appreciated by those skilled in the art that two such areas may be provided in which to record paint information for two different colors of paint used in the room. The adhesive label 10 further includes an area 18 to which the logo of a paint manufacturer, hardware store, etc. may be pre-printed, as well as an area 20 which may be pre-printed with the address of such an establishment. In this way, the adhesive label 10 may be distributed as a promotional item, for instance at the point of sale when the paint is purchased. The adhesive label 10 will also serve as effective advertising at a future date when the label 10 is referenced to retrieve the appropriate paint information when repainting is necessary.

In order to ensure that the adhesive label 10 may be conveniently written upon by the user with any type of marking instrument, such as a ball point pen or a pencil, the front surface 22 of the adhesive label 10 comprises a smooth, calendered surface. The surface 22 should therefore be formed to be as smooth and flat as possible and should not have too glossy a finish thereon, as this would prevent marking thereon by an ordinary ball point pen or pencil. The surface of the adhesive label 10 opposite the front surface 22 preferably carries an adhesive thereon suitable to attach the label 10 to the rear surface of the electrical cover plate. A backing sheet (not shown) may be applied to the adhesive to prevent the label from adhering to any surfaces prior to removal of the backing sheet and application of the label 10 to the electrical cover plate. Alternatively, the label 10 may be formed without an adhesive layer, the label 10 being held against the rear surface of the electrical cover plate solely by the screws (not shown) which couple the electrical plate to the wall.

Figure 2:
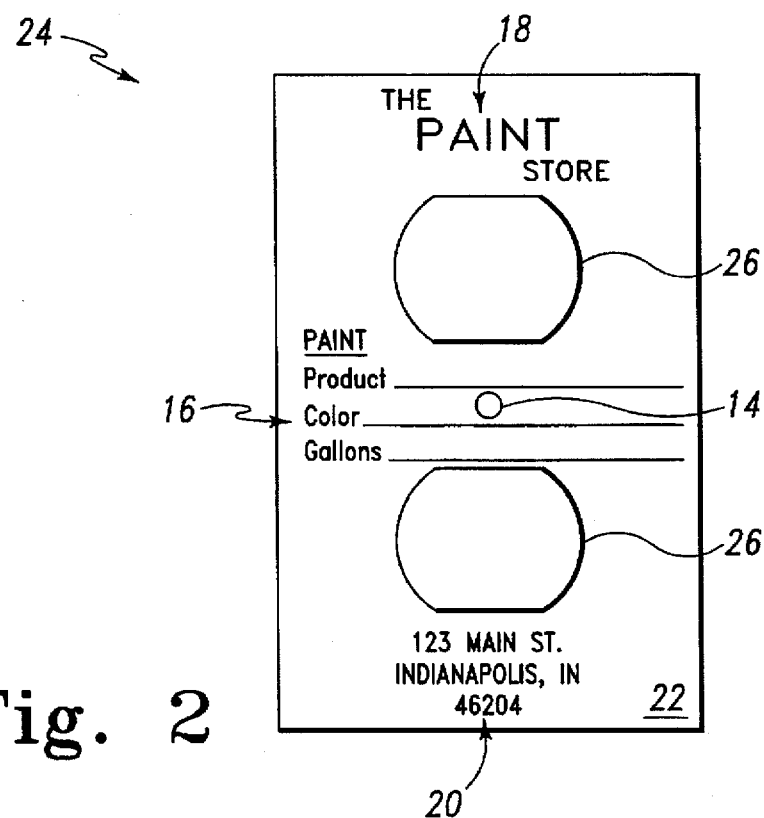
FIG. 2 is a top plan view of a second embodiment of the adhesive label of the present invention.

Referring now to FIG. 2, there is illustrated a second embodiment adhesive label of the present invention indicated generally at 24. The adhesive label 24 is configured to be used with an electrical cover plate for an electrical outlet. Therefore, the adhesive label 24 includes two cut-outs 26 which are sized and shaped just slightly larger than the corresponding cut-outs in an electrical cover plate for an electrical outlet. Otherwise, the adhesive label 24 incorporates features which are analogous to the adhesive label 10 of FIG. 1. Those skilled in the art will appreciate that similar adhesive labels will be formed to be applied to other electrical cover plate configurations.

Figure 3:
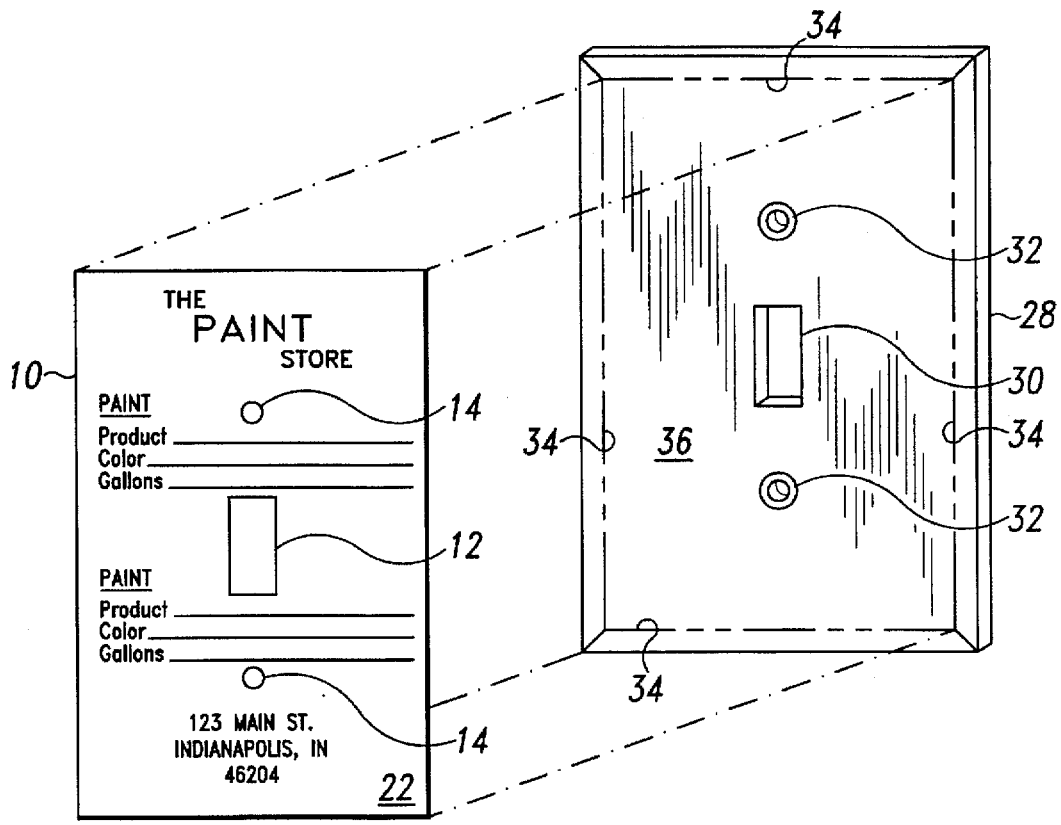
FIG. 3 illustrates the application of the first embodiment adhesive label of the present invention to the rear of a light switch cover plate.

Referring now to FIG. 3, application of adhesive label 10 to the rear surface of an electrical cover plate 28 is illustrated. The electrical cover plate 28 is of a standard construction and includes a central opening 30 which is adapted to allow a light switch to pass therethrough when the electrical cover plate 28 is mounted to a wall. Screw holes 32 are provided to allow the electrical cover plate mounting screws to pass therethrough. The electrical cover plate 28 will commonly include a beveled surface 34 around the perimeter thereof. The area 36 bounded by the beveled surfaces 34 on the rear of the electrical cover plate 28 is the area upon which the adhesive label 10 is adhesively mounted. The adhesive label 10 is sized so as to remain completely within the space 36 and not to extend into the beveled area 34. Additionally, the central cut-out 12 is sized to be just slightly larger than the central cut-out 30 of the electrical cover plate 28 in order to guarantee that the adhesive label 10 does not interfere with passage of the light switch through the cut-out 30. Likewise, the cut-outs 14 of the adhesive label 10 are sized just slightly larger than the cut-outs 32 of the electrical cover plate 28.

Once the adhesive label 10 has been mounted to the rear surface 36 of the electrical cover plate 28, it will form a semi-permanent record of the paint which has been used on the walls of the room. The paint information may be recorded on the adhesive label 10 either before or after the adhesive label 10 has been mounted to the electrical cover plate 28. Because the label 10 includes a smooth, calendered surface 22, the paint information may be recorded thereon with an ordinary ball point pen or pencil, which would not be possible upon the slick plastic surface 36 of the electrical cover plate 28. Furthermore, if the paint information ever needs to be changed, the old paint information may be erased from the adhesive label 10 if it was written in pencil, or a new adhesive label 10 may be placed over the old adhesive label 10 in order to record the new information. Alternatively, the old adhesive label 10 may be removed from the electrical cover plate 28 prior to adhering a new label 10 thereon. Also, if the space 36 includes reinforcing ribs or the like, the label 10 may easily be applied over such surface irregularities.

Figure 4:
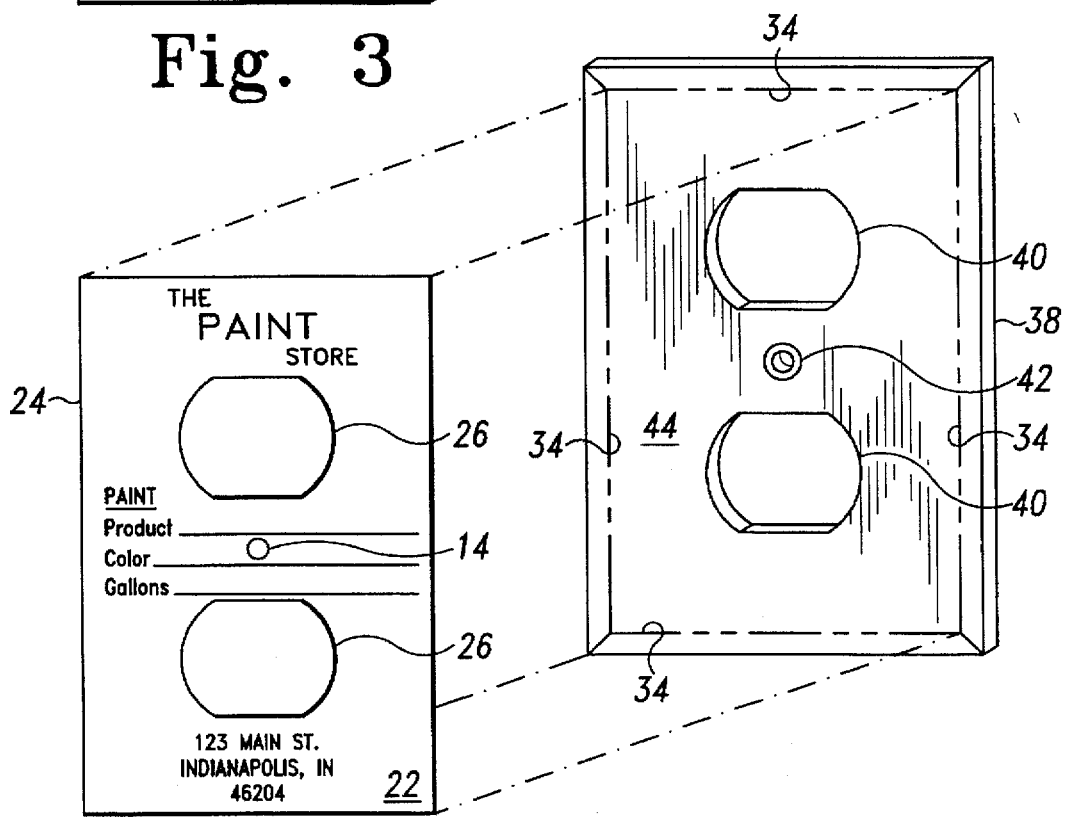
FIG. 4 illustrates the application of the second embodiment adhesive label of the present invention to the rear of an electrical outlet cover plate.

Referring now to FIG. 4, application of the second embodiment adhesive label 24 to an electrical cover plate 38 is illustrated. The electrical plate 38 is of standard construction and includes two openings 40 which are adapted to allow electrical outlets to pass therethrough when the electrical cover plate 38 is mounted to a wall. Screw hole 42 is provided to allow the electrical cover plate mounting screw to pass therethrough. The electrical cover plate 38 will commonly include a beveled surface 34 around the perimeter thereof. The area 44 bounded by the beveled surfaces 34 on the rear of the electrical cover plate 28 is the area upon which the adhesive label 24 is adhesively mounted. The adhesive label 24 is sized so as to remain completely within the space 44 and not to extend into the beveled area 34. Additionally, the cut-outs 26 are sized to be just slightly larger than the cut-outs 40 of the electrical cover plate 38 in order to guarantee that the adhesive label 24 does not interfere with passage of the electrical outlets through the cut-outs 40. Likewise, the cut-out 14 of the adhesive label 24 is sized just slightly larger than the cut-out 42 of the electrical cover plate 38.

Once the adhesive label 24 has been mounted to the rear surface 44 of the electrical cover plate 38, it will form a semi-permanent record of the paint which has been used on the walls of the room. The paint information may be recorded on the adhesive label 24 either before or after the adhesive label 24 has been mounted to the electrical cover plate 38. Because the label 24 includes a smooth, calendered surface 22, the paint information may be recorded thereon with an ordinary ball point pen or pencil, which would not be possible upon the slick plastic surface 44 of the electrical cover plate 38. Furthermore, if the paint information ever needs to be changed, the old paint information may be erased from the adhesive label 24 if it was written in pencil, or a new adhesive label 24 may be placed over the old adhesive label 24 in order to record the new information. Alternatively, the old adhesive label 24 may be removed from the electrical cover plate 38 prior to adhering a new label 24. Also, if the space 44 includes reinforcing ribs or the like, the label 24 may easily be applied over such surface irregularities.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. The combination, comprising:
    an electrical cover plate adapted to be mounted to a wall and having a front surface facing away from the wall when mounted, a rear surface facing the wall when mounted and a bevel at a perimeter of the electrical cover plate; and
    a label having a first side and a second side;
    wherein the second side of the label is mounted to the rear surface of the electrical cover plate;
    wherein the first side of the label has a smooth surface so that the first side may be written upon with a pencil; and
    wherein the label is contained completely within the perimeter bevel of the electrical cover plate so that any writing on the label surface is not visible when the electrical cover plate is mounted to the wall.

2. The combination of claim 1, wherein the second side of the label is mounted to the rear surface of the electrical cover plate by an adhesive coating therebetween.

3. The combination of claim 1, wherein the label includes a plurality of first cut-outs which are larger than corresponding second cut-outs in the electrical cover plate.

4. A method of archiving information about room decorations, comprising the steps of:
    (a) collecting the information about the room decorations;
    (b) recording the information upon a first surface of a label;
    (c) mounting the label to a rear surface of an electrical cover plate; and
    (d) attaching the electrical cover plate to a wall such that the label faces the wall and the recorded information is not visible when the electrical cover plate is mounted to the wall.

5. The method of claim 4, wherein step (c) comprises adhering a second surface of the label to the rear surface of the electrical cover plate.

* * * * *